US012633335B2

(12) United States Patent
Isakanian et al.

(10) Patent No.: US 12,633,335 B2
(45) Date of Patent: May 19, 2026

(54) ONE-SIDED TRANSMITTER EQUALIZATION

(71) Applicant: QUALCOMM Incorporated, San Diego, CA (US)

(72) Inventors: Patrick Isakanian, El Dorado Hills, CA (US); Jaseem Ahammed, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 190 days.

(21) Appl. No.: 18/677,014

(22) Filed: May 29, 2024

(65) Prior Publication Data

US 2025/0372153 A1     Dec. 4, 2025

(51) Int. Cl.
*G11C 11/063*          (2006.01)
*G11C 11/4093*        (2006.01)

(52) U.S. Cl.
CPC ................................. G11C 11/4093 (2013.01)

(58) Field of Classification Search
CPC .................................................. G11C 11/4093
USPC .................................................... 365/189.18
See application file for complete search history.

(56) References Cited

U.S. PATENT DOCUMENTS 7,054,401 B2 *   5/2006   Kada ........................ H04L 25/14
                                                          375/355
8,121,237 B2 *   2/2012   Stott .................... G11C 7/1096
                                                          375/355

8,423,813 B2 *   4/2013   Huang ...................... G06F 5/06
                                                          713/401
11,018,904 B1   5/2021   Mathew et al.
11,152,045 B2 *  10/2021  Cho ............... H03K 19/018507
11,824,695 B2   11/2023  Valaee et al.
2011/0239030 A1 *  9/2011  Ware ..................... G06F 3/0673
                                                          713/400
2015/0341019 A1  11/2015  Jung
2019/0349226 A1  11/2019  Chong

OTHER PUBLICATIONS

Cho S-Y., et al., "A 16-Gb 37-Gb/s GDDR7 DRAM With PAM3-Optimized TRX Equalization and ZQ Calibration", IEEE Journal of Solid-State Circuits, vol. 60, No. 1, Jan. 2025, pp. 184-196.
International Search Report and Written Opinion—PCT/US2025/026257—ISA/EPO—Jul. 21, 2025.

* cited by examiner

*Primary Examiner* — Tha-O H Bui
(74) *Attorney, Agent, or Firm* — Loza & Loza, LLP

(57)          ABSTRACT

An equalizing transmitter coupled to a communication channel includes a plurality of driver segments, at least one equalizer segment, a delay element and a logic circuit. Each driver segment in the plurality of driver segments includes a pullup transistor that is configured to couple the communication channel to a first voltage rail when an input signal is in a first signaling state. The at least one equalizer segment includes a pullup transistor configured to couple the communication channel to the first voltage rail when turned on. The delay element is configured to provide a precursor signal that is a delayed version of the input signal. The logic circuit is responsive to the precursor signal and provides an enabling signal that enables the at least one equalizer segment to be turned on when the precursor signal is in a second signaling state.

20 Claims, 9 Drawing Sheets

100

102 Central Processing Unit (CPU)

104 Modem Processor

106 Graphics Processor (GPU)

108 Application Processor

122 Interconnection/Bus Module

112 Serial Bus Controller

114 Memory Controller

116 Centralized Resource Manager (CRM)

110 System Components and Resources

126 Memory Interface/Bus

124 Memory

Voltage-Mode Transmitter With Equalizer

Current-Mode Transmitter With Equalizer

700

702 — Delay Structure-A

720

722 — Delay Structure-B

740

742 — Delay Structure-C

ONE-SIDED TRANSMITTER EQUALIZATION

TECHNICAL FIELD

The present disclosure generally relates to equalization on high-speed interfaces and, more particularly, to equalization circuits provided in a transmitter.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In high-speed applications, timing of the operation of a SERDES may be controlled by one or more clock signals. Data rates supported or available on a serial data link may be limited by interference, noise, reflections and other characteristics of the communication channel provided by the serial data link. Performance, accuracy or reliability of the SERDES may depend on the availability of equalizing circuits that can reduce errors in received data due to channel imperfections. Conventional systems often use equalizers that are complex, occupy large areas within an IC device and that can consume excessive power. There is an ongoing need for new and efficient equalizers for high-speed serial links.

SUMMARY

Certain aspects of the disclosure relate to systems, apparatus, methods and techniques that can be used in equalizing circuits in a transmitter coupled to a serial data link. Certain aspects of this disclosure relate to an equalizer that provides one-sided deemphasis to a transmitter in a low-power double data rate memory interface. In one example, deemphasis is applied to sections of a driver circuit that pull an output signal to a positive or negative voltage with respect to circuit ground. In some examples, one-sided deemphasis is not applied to sections of a driver circuit that pull the output signal to circuit ground with respect to circuit ground.

In various aspects of the disclosure, an equalizing transmitter coupled to a communication channel includes a plurality of driver segments, at least one equalizer segment, a delay element and a logic circuit. Each driver segment in the plurality of driver segments includes a pullup transistor that is configured to couple the communication channel to a first voltage rail when an input signal is in a first signaling state. The at least one equalizer segment includes a pullup transistor configured to couple the communication channel to the first voltage rail when turned on. The delay element is configured to provide a precursor signal that is a delayed version of the input signal. The logic circuit is responsive to the precursor signal and provides an enabling signal that enables the at least one equalizer segment to be turned on when the precursor signal is in a second signaling state.

In various aspects of the disclosure, an apparatus includes means for driving a communication channel, means for equalizing signals transmitted over the communication channel, means for generating a precursor signal by delaying the input signal, and means for enabling the at least one equalizer segment when the precursor signal is in a second signaling state. The means for driving the communication channel drives the communication channel according to an input signal received at the apparatus. The means for driving the communication channel includes a pullup transistor in each of a plurality of driver segments that is configured to couple the communication channel to a first voltage rail when the input signal is in a first signaling state. The means for equalizing signals transmitted over the communication channel, includes at least one equalizer segment configured to provide deemphasis when the input signal transitions to the first signaling state.

In various aspects of the disclosure, a method for equalizing a data signal transmitted over a serial transmission channel includes driving the communication channel according to an input signal provided to a plurality of driver segments, each driver segment including a pullup transistor that is configured to couple the communication channel to a first voltage rail when the input signal is in a first signaling state; causing at least one equalizer segment couple the communication channel to the first voltage rail when a pullup transistor in the at least one equalizer segment is turned on; generating a precursor signal by delaying the input signal; and providing the precursor signal to a logic circuit that is configured to generate an enabling signal that enables the at least one equalizer segment to be turned on when the precursor signal is in a second signaling state.

In one aspect, each of the plurality of driver segments includes a pulldown transistor that is configured to couple the communication channel to a second voltage rail when the input signal is in a second signaling state.

In certain aspects, the precursor signal is delayed by at least one unit interval (UI) in which a data bit is transmitted over the communication channel. The delay element may include a configurable delay cell that is configured to delay the input signal by the at least one UI with respect to an edge in a clock signal used to define the UI.

In certain aspects, the delay element includes a flipflop that is configured to add a delay to the precursor signal corresponding to duration of a UI in which a data bit is received in the input signal.

In certain aspects, the enabling signal is a multibit signal that configures the value of a pullup resistance used to couple the communication channel to the first voltage rail when the at least one equalizer segment turned on. The logic circuit may be configured to refrain from providing the enabling signal when the precursor signal is in the first signaling state.

DETAILED DESCRIPTION

Figure 1:
FIG. 1 illustrates an example of a system-on-a-chip (SOC) that may be adapted in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain aspects of the disclosure are applicable to serializer/deserializer (SERDES) circuits used to transmit and receive data over a serial communication link. SERDES circuits may be included in certain input/output (I/O) circuits. For example, SERDES circuits may be used in an IC device that provide an interface between core circuits and memory devices. Many mobile devices employ Synchronous Dynamic Random Access Memory (SDRAM), including Low-Power Double Data Rate (DDR) SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies.

FIG. 1 illustrates example components and interconnections in a system-on-chip (SoC) 100, including a memory interface/bus 126, that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via the memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
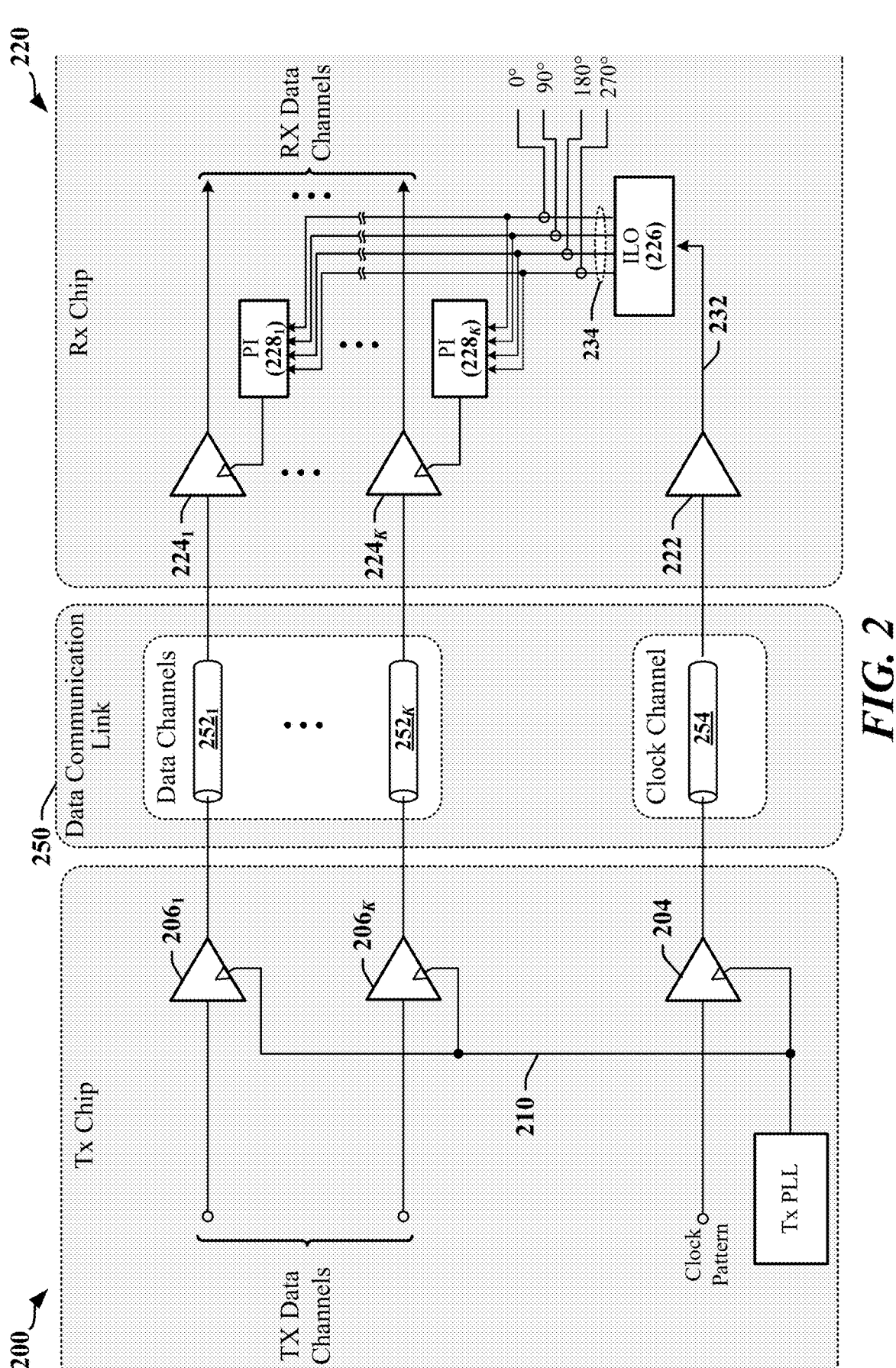
FIG. 2 illustrates an example of a system that employs a multi-channel data communication link.

FIG. 2 illustrates an example of a system that employs a multi-channel data communication link 250 to couple a transmitting device 200 with a receiving device 220. The data communication link 250 includes data channels 252₁-

6

252_K that provide a transmission medium through which signals propagate from a first device to a second device. In the illustrated example, the transmitting device 200 can be configured to transmit data signals over one or more data channels 252₁-252_K in accordance with timing information provided by a clock signal 210 that may be transmitted over a clock channel 254. The transmitting device 200 may include serializers (not shown) configured to convert parallel data into serial data for transmission over the data channels 252₁-252_K. The transmitting device 200 further includes data drivers 206₁-206_K configured to generate data signals over the one or more data channels 252₁-252_K to the receiving device 220 through the data communication link 250.

In some examples, the transmitting device 200 includes a clock driver 204 that forwards the clock signal 210 over the clock channel 254. In other examples, the clock channel 254 is omitted and the receiving device 220 is equipped with clock recovery circuits that can recover timing information from signals transmitted over one or more of the data channels 252₁-252_K in order to generate receive clock signals. Clock forwarding is common in communication systems, and provides the benefit that a phase locked loop (PLL) and other clock recovery circuits are not required in the receiving device 220. Typically, only one phase of the transmitter-generated clock signal is forwarded when clock forwarding is used. Limiting the number of clock signals can conserve power and the space that would be occupied by additional clock channels.

The receiving device 220 may be configured to receive and process the data signals. The receiving device 220 may generate additional phases of the received or recovered clock signal to obtain in-phase and quadrature (I/Q) versions of the clock signal to be used by phase interpolators 228₁-228_K. A quadrature signal has phase that is shifted by 90° with respect to an in-phase signal. The phase interpolators 228₁-228_K may provide outputs that are phase-adjusted or phase-corrected I/Q versions of the clock signal. In one example, the outputs of each of the phase interpolators 228₁-228_K are provided to sampling circuits 224₁-224_K.

Clock generation circuits in the receiving device 220 may include oscillators, which are fundamental building blocks of modern electronics. Oscillators are often implemented as ring oscillators (ROs), which can offer advantages over other types of oscillator including reduced area footprint, power efficiency and scalability with technological process. In the illustrated example, the clock generation circuits in the receiving device 220 includes an injection-locked oscillator (ILO 226) that receives a clock signal 232 from a line receiver 222 coupled to the clock channel 254 and generates phase-shifted versions 234 of the clock signal 232, including I/Q versions of the clock signal 232.

In high-speed applications, data throughput of a serial data link may be limited by the characteristics of the channel used to carry data signals. Impedance mismatches, parasitic coupling and other factors can cause signal distortion. In many implementations, equalization circuits and capabilities are included in input/output (I/O) circuits to compensate for signal distortions attributable to inter-symbol interference (ISI), reflection and other effects that can combine to limit bandwidth in a channel. ISI can result when a first-received symbol interferes with subsequently received symbols due to reflections, frequency-dependent delays and other imperfections in the channel. A symbol may refer to signaling state within a unit interval (UI), or symbol interval, in which data is modulated or encoded in the waveform of a transmitted signal. In single data rate applications, a UI corresponds to the period of a transmit clock signal that controls transmissions over the channel. In double data rate applications, a UI corresponds to a half-period of the transmit clock signal that controls transmissions over the channel.

Figure 3:
FIG. 3 illustrates certain effects of channel loss, parasitic losses and interference on a communication channel.
Figure 3:
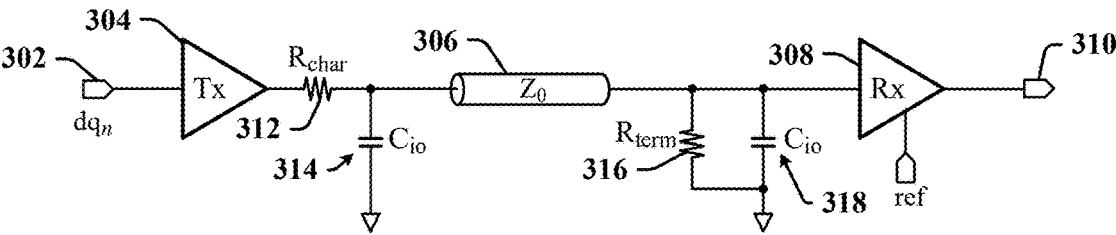
Figure 3:
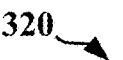
Figure 3:
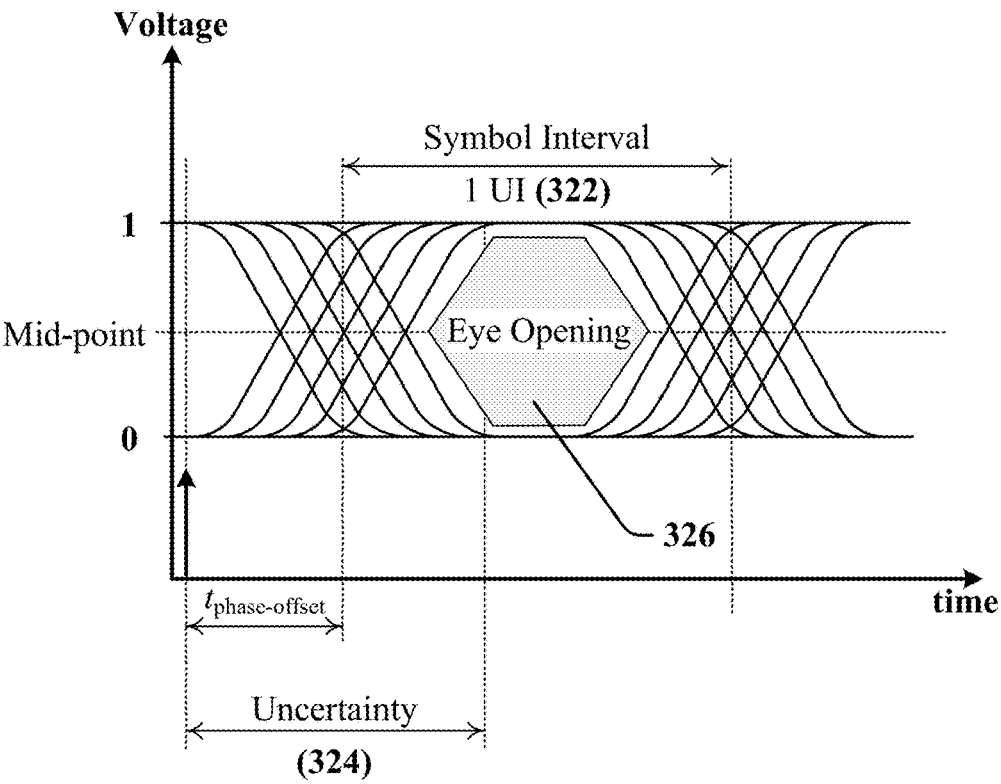
Figure 4:
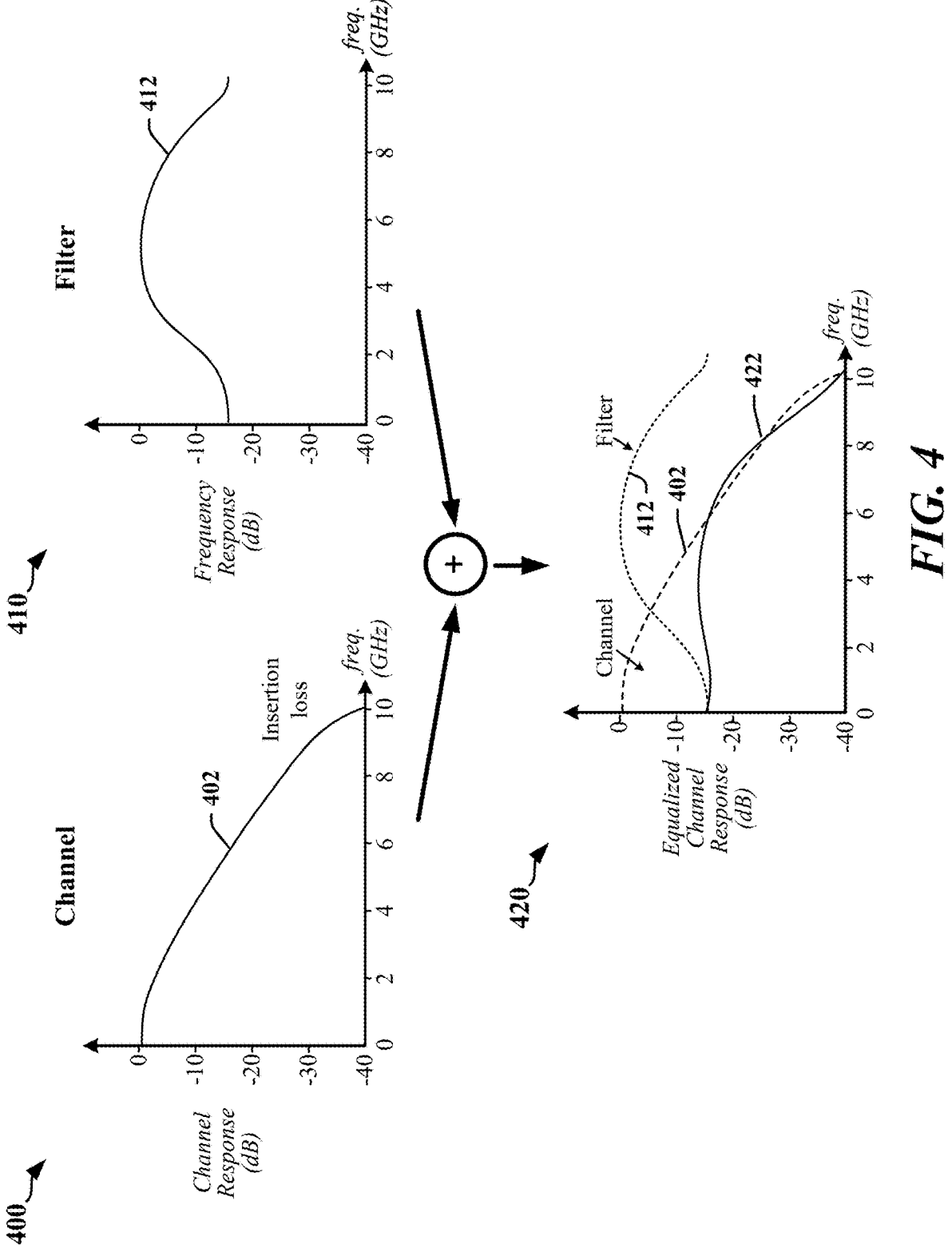
FIG. 4 illustrates certain aspects of channel response related to the operation of the communication channel of FIG. 3.

FIG. 3 illustrates a serial link 300 in which a transmitter 304 is coupled to a receiver 308 through a channel 306. In one example, the channel 306 is a serial communication channel and may be implemented using some combination conductive traces on a circuit board or within a conductive layer of a semiconductor IC device and/or other interconnects such as strip line, microstrip, coaxial cable and/or wires. The combination of driver output resistance 312, receiver termination resistance 316 and parasitic and other capacitances 314, 318 can cause channel loss and parasitic losses that affect different frequencies in a transmitted signal to different degrees and can cause the received signal 310 to be a distorted version of the input data signal 302. FIG. 4 provides a channel response diagram 400 that illustrates an example of the frequency response 402 of the channel 306. Transmissions over the channel 306 may be affected by ISI caused by imperfect impedance matching between the channel 306 and the transmitter 304 and the receiver 308. The transmitted signal may include different and variable frequencies due to patterns of data bits in the input data signal 302. Some combination of channel loss, parasitic losses and ISI may affect signal rise and fall times and may introduce timing uncertainty to the received signal 310, which may be discernible in an eye diagram.

FIG. 3 includes an eye diagram 320 generated as an overlay of multiple symbol intervals, including a single symbol interval 322. The eye diagram 320 illustrates transmissions in which timing of transitions between symbol values varies over a number of symbol intervals 322. In many instances, signaling levels vary during transitions. A signal transition region 324 represents a time period of uncertainty at the boundary between two symbols where variable signal rise times prevent reliable decoding. State information may be determined reliably in a region defined by an eye opening 326 that represents the time period in which the symbol is stable and can be reliably received and decoded. The eye opening 326 may define a region in which mid-point crossings do not occur and a receiver or decoder can reliably sample, demodulate or decode information from a data signal in the symbol interval 322. The eye opening 326 may be narrowed along the time axis by increases in data rate and may be compressed in the voltage axis by ISI and other types of interference and distortion. A SERDES-based communication system may use an eye opening 326 in an eye diagram 320 as a basis for judging the ability of a receiver to reliably recover data from signals transmitted over a channel that is affected by noise, channel loss, parasitic losses and ISI. The channel may include a serial transmission line.

Equalizers are commonly used in transmitters that drive serial links, including SERDES-based links. Transmitter-based equalizers aim to flatten the frequency response of the channel and reduce time-domain ISI at the receiver by pre-emphasis or de-emphasis performed at the transmitter. An equalizer circuit in the transmitter may be configured to boost the power of certain frequencies in a signal to be transmitted in order to counteract attenuation and interference that can affect the signal during transmission through the channel. In some instances, a transmitter-based equalizer used for a signal may be configured to boost the higher frequencies in the signal to improve edge transition at the receiver.

FIG. 4 illustrates certain aspects of the operation of a transmitter-based equalizer. As shown in the channel response diagram 400, higher frequencies in a signal transmitted through the channel are attenuated more than lower frequencies. A frequency response diagram 410 illustrates the frequency response 412 of a filter that may be used for shaping de-emphasis in a transmitter. The filter may be configured to attenuate different frequencies by different amounts. The filter produces a signal that counteracts the effects of frequency-dependent variations in attenuation evident in the frequency response 402 of a channel. The equalized channel response diagram 420 illustrates the frequency response 422 of the equalized channel as observed at the receiver. The equalized channel response diagram 420 may be approximated by superimposing the frequency response 402 of the channel on the frequency response 412 of the filter used to shape the data signal. The resultant frequency response 422 of the equalized channel is flattened over a targeted range of frequencies.

Figure 5:
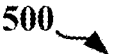
FIG. 5 illustrates certain examples of one-tap transmitter-based equalizers.
Figure 5:
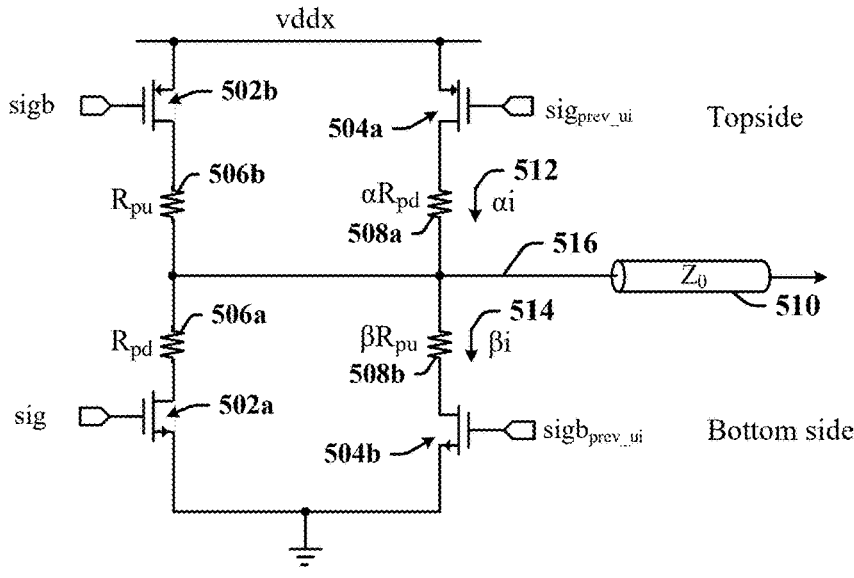
Figure 5:
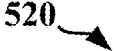
Figure 5:
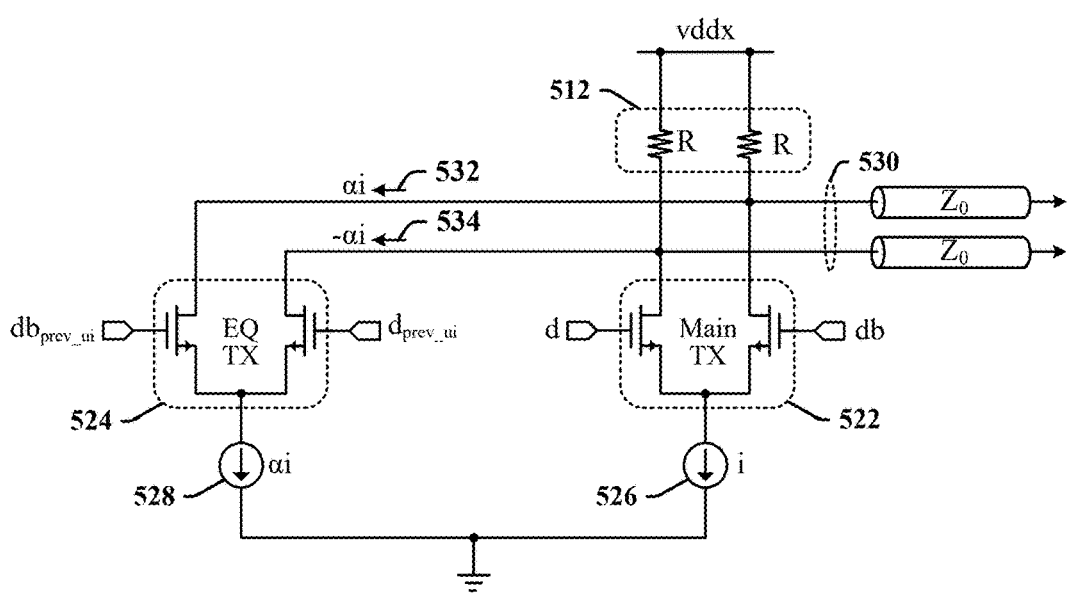

FIG. 5 illustrates certain examples of one-tap transmitter-based equalizers. The one-tap equalizers are representative of multi-tap equalizers which combine a received data signal in a current UI with feedback obtained by weighting bit values captured from previous UIs. Magnitudes and polarities of the weights applied to the bit values captured from previous UIs may be configured, calibrated or adjusted to compensate for channel characteristics. The feedback signal provided in a one-tap equalizer may be generated using the bit value captured from the immediately preceding UI.

As illustrated in FIG. 5, a transmitter-based equalizer can be implemented in a voltage mode driver 500 or in a current mode driver 520. The outputs of the drivers may be preconditioned by pre-equalizing circuits in order to combat or compensate for signal distortions attributable to inter-symbol interference (ISI), reflection and other effects associated with a communication channel. A pre-equalizing circuit may be referred to herein as a feed-forward equalizer or 'FFE'.

The illustrated voltage mode driver 500 includes a pair of driver transistors 502a, 502b is configured to drive an output signal 516 over the channel 510. Equalization is provided using switchable resistors including a pulldown resistor 508b (αRpd) and a pullup resistor 508a (βRpu). A pair of equalizer transistors 504a, 504b can be used to boost the voltage of the output signal 516 based on the signaling state of the preceding UI. The driver impedance is determined by the resistance values of driver resistors 506a, 506b and the resistance values of the pullup resistor 508a and the pulldown resistor 508b when the equalizer transistors 504a, 504b are activated. The equalizer transistors 504a, 504b increase the current flow in the voltage mode driver 500 when the equalizer transistors 504a, 504b are activated. Equalization in the voltage mode driver 500 introduces an equalizing current and may alter the driver output impedance. A topside current 512 (αi) flows when the topside equalizer transistor 504a is active and a bottom side current 514 (βi) flows when the topside bottom side transistor 504b is active.

The illustrated current mode driver 520 is configured to drive a current through a pair of wires that provides a communication channel. Current flows in opposite directions in the two wires. The current mode driver 520 can control direction of flow of a main drive current (±i) over the communication channel, where the main drive current is provided by a driver current source 526. A pair of driver transistors 522 is configured to drive a differential output signal 530 over the communication channel responsive to a differential input signal. A differential signal includes a pair of complementary signals that have voltage or current of equal magnitude and opposite polarity. Signaling state of a differential signal is represented in the difference between the differential signal pair. Equalization is provided in the current mode driver 520 by providing or controlling an equalizing current 532, 534 (±αi) that is contributed by an equalizer current source 528 to the differential output signal 530. A pair of equalizer transistors 524 can be used to control direction and amplitude of the equalizing current 532, 534 based on the signaling state of the preceding UI.

The equalizer structures illustrated in FIG. 5 can be extended to provide multi-tap equalization. Every tap requires a delay element to produce a delay that is a fraction or a multiple of one UI in which a bit of data can be encoded in the waveform of a transmitted signal. Conventional multi-tap equalization requires multiple flipflops and generates substantial equalizing currents, which are typically "discarded" but can be recycled using complex switching circuits to maintain a constant driver output impedance. Constant driver output impedance is required for voltage mode. Conventional equalization results in increased power consumption, circuit complexity and generally requires mitigation or tradeoffs to limit increases in input/output (I/O) pad capacitance.

Certain aspects of this disclosure relate to a voltage mode driver that provides topside equalization affecting the higher voltage signaling state in a waveform. The resultant voltage mode driver can use deemphasis to advantageously equalize channel losses. For the purposes of this disclosure, deemphasis includes reducing the magnitude of the direct current (DC) content of a waveform such that the proportion of high frequency content in the resultant signal of the waveform is increased. In terms of relative magnitudes, deemphasis can boost higher frequency content with respect to lower frequency content. Power savings are obtained when bottom side (lower voltage) is not corrected and when deemphasis is used.

Figure 6:
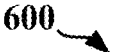
FIG. 6 illustrates elements of a timer-based, edge-boosting equalizer provided in accordance with certain aspects of this disclosure.
Figure 6:
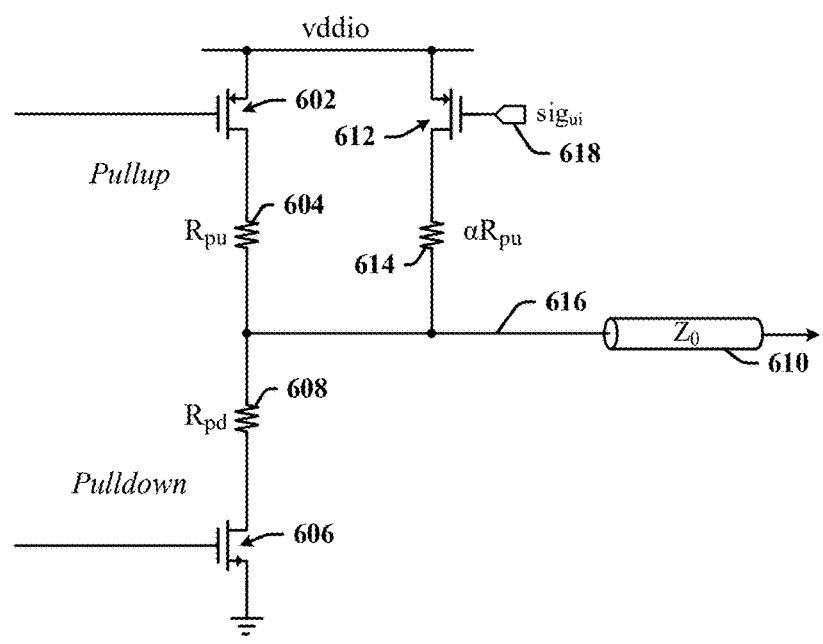
Figure 6:
Figure 6:
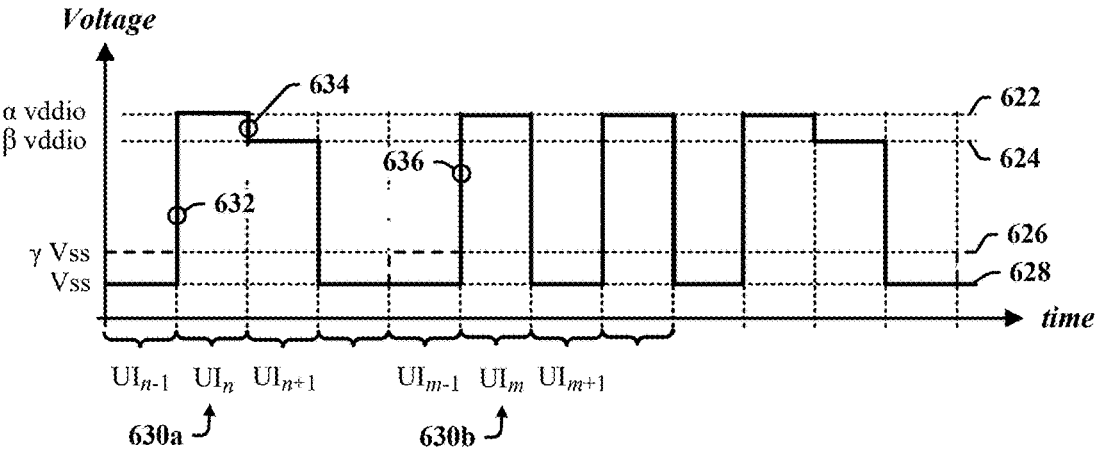

FIG. 6 illustrates an example of a voltage mode driver 600 that provides equalization in accordance with certain aspects of this disclosure. The voltage mode driver 600 provides equalization at higher voltage levels in a waveform, with no equalization provided at lower voltage levels. For ease of description, the illustrated voltage mode driver 600 provides 1-tap equalization but certain concepts disclosed herein are equally applicable to voltage mode drivers that provide multi-tap equalization. For ease of description, the illustrated voltage mode driver 600 includes one driver segment and one equalizer segment but certain concepts disclosed herein are equally applicable to voltage mode drivers that includes multiple driver segments and/or multiple equalizer segments. The driver segment in the voltage mode driver 600 includes a pullup driver transistor 602 and a pulldown driver transistor 606. When turned on, the pullup driver transistor 602 couples an output signal 616 to the positive-voltage power rail (vddx) through a pullup resistor 604. When turned on, the pulldown driver transistor 606 couples the output signal 616 to circuit ground through a pulldown resistor 608.

The equalizer segment in the voltage mode driver 600 includes a pullup resistor 614 (αRpu) for equalization purposes. A deemphasis transistor 612 operates as a switch and is controlled by a feedback signal 618 (sig$_{ui}$) that is generated in each UI based on the data bit value transmitted in the immediately preceding UI. When turned on, the deemphasis transistor 612 couples the output signal 616 to the positive-voltage power rail (vddx) through pullup resistor 614. The deemphasis transistor 612 is configured to disable a portion of the pullup strength of the voltage mode driver 600 and thereby decrease the DC content of the waveform. In one example, the deemphasis transistor 612 may be configured to disable 5% of the pullup strength of the voltage mode driver 600. In some instances, the deemphasis transistor 612 is directly responsible for the attenuation of the waveform. In one example, the deemphasis transistor 612 can be turned on when the data bit value transmitted in the immediately preceding UI causes the pulldown driver transistor 606 to be turned on. In the latter example, the deemphasis transistor 612 is turned off when the data bit value transmitted in the immediately preceding UI causes the pullup driver transistor 602 to be turned on.

The timing diagram 620 illustrates the effect of the deemphasis transistor 612 on the output signal 616. The timing diagram 620 plots voltage of the output signal 616 against time, with the time being measured as a sequence of consecutive UIs. A first example of the effect of the deemphasis transistor 612 relates to a first UI 630a, which is labeled in FIG. 6 as UI$_n$. Prior to the first UI 630a, the output signal 616 is in a low signaling state that corresponds to circuit ground 628 (Vss). The deemphasis transistor 612 is turned on when the output signal 616 is at circuit ground 628 and actively drives the output signal 616 in parallel with the pullup driver transistor 602 during the transition 632 at the beginning of the first UI 630a. When turned on, the deemphasis transistor 612 reduces the output impedance of the voltage mode driver 600 and increases the current flowing through the communication channel 610. The increased current can decrease rise time of the transition 632 and can result in the output signal 616 reaching a first output voltage level 622 (α Vddio).

An equalizer feedback circuit responds to the data bit value received in the first UI 630a and, at some point in time during the first UI 630a, the feedback signal 618 causes the deemphasis transistor 612 to be turned off. In the illustrated example, the deemphasis transistor 612 is turned off at the end of the first UI 630a. In other examples, the deemphasis transistor 612 may be turned off before or after the end of the first UI 630a. Turning off the deemphasis transistor 612 causes a transition 634 in the output signal 616 as the voltage of the output signal 616 drops from the first output voltage level 622 to a second output voltage level 624 (β Vddio). The voltage difference between the first output voltage level 622 and the second voltage level 624 may be determined by the contribution of the switchable pullup resistor 614 to the output impedance of the voltage mode driver 600. In one example, the voltage difference between the first output voltage level 622 and the second voltage level 624 may be determined by the ratio of impedances contributions of the equalizer segments and driver segments.

A second example of the effect of the deemphasis transistor 612 relates to a second UI 630b, which is labeled in FIG. 6 as UI$_m$. Prior to the second UI 630b, the output signal 616 is at circuit ground 628 (Vss or circuit ground). The deemphasis transistor 612 is turned on when the output signal 616 is at circuit ground 628 and actively drives the output signal 616 in parallel with the pullup driver transistor 602 during the transition 636 at the beginning of the second UI 630b. When turned on, the deemphasis transistor 612 reduces the output impedance of the voltage mode driver 600 and increases the current flowing through the communication channel 610. The increased current can decrease rise time of transition 636 and can result in the output signal 616 reaching the first output voltage level 622 (α Vddio).

An equalizer feedback circuit responds to the data bit value received in the second UI 630b and, at some point in time during the second UI 630b, the feedback signal 618 causes the deemphasis transistor 612 to be turned off. In the illustrated example, the deemphasis transistor 612 is turned off at the end of the second UI 630*b* when the output signal 616 transitions to circuit ground 628.

For reference purposes only, the timing diagram 620 shows a pre-emphasis signaling state 626 (γ Vss) that is higher in voltage level than circuit ground 628. In conventional equalizers, a bottom side pre-emphasis circuit would drive the output signal 616 to the pre-emphasis signaling state 626 when a transition 632, 636 from circuit ground 628 to the first output voltage level 622 or the second output voltage level 624, either of which may be referred to as a high output voltage level or as a positive voltage level herein. The bottom side pre-emphasis circuit introduces additional circuit complexity and causes a greater level of power dissipation than expected from a one-sided equalizing voltage mode driver implemented in accordance with certain aspects of this disclosure. Furthermore, the one-sided equalization provided by the presently disclosed voltage mode drivers adds no pad capacitance and can save power at the output.

Figure 7:
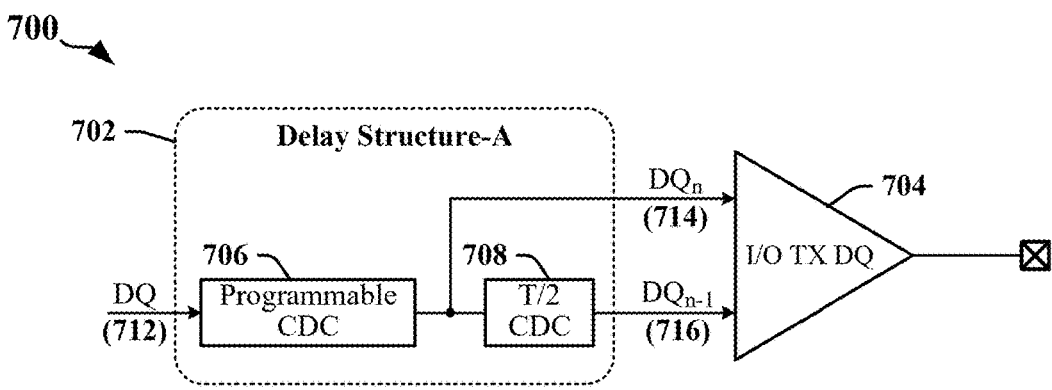
FIG. 7 illustrates an example of an equalizing voltage mode driver that can provide one-sided deemphasis in accordance with certain aspects of this disclosure.
Figure 7:
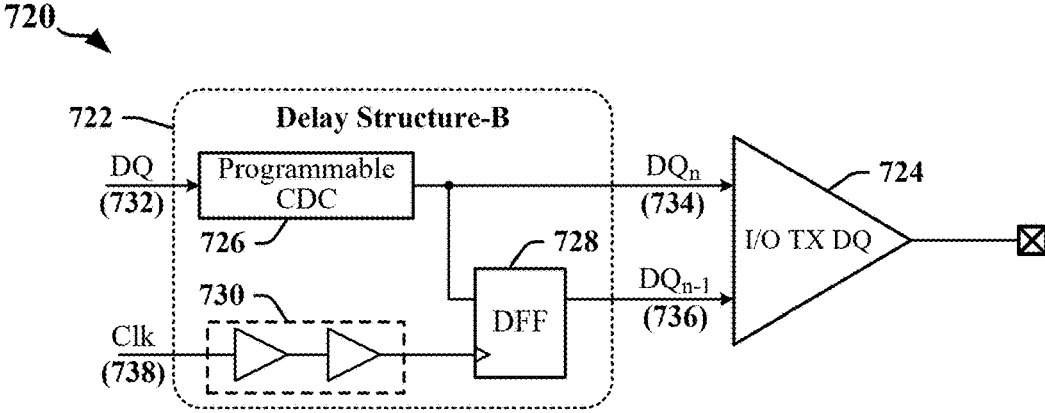
Figure 7:
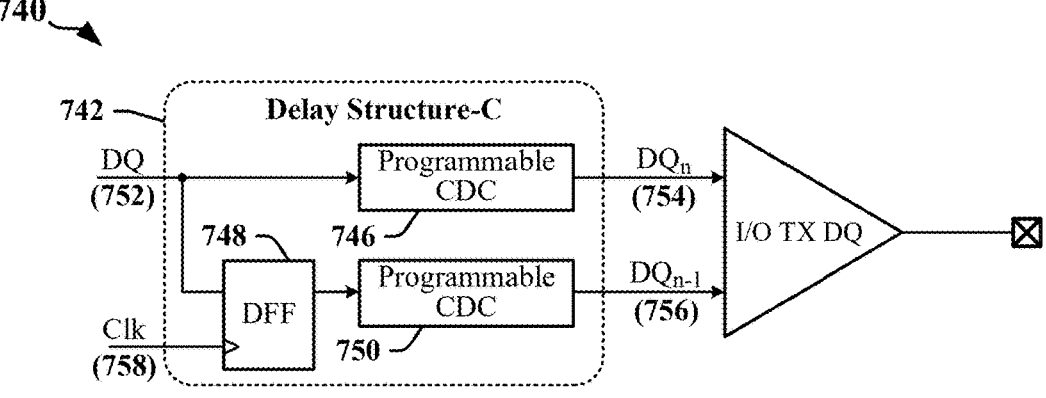

FIG. 7 illustrates examples of input/output (I/O) interface circuits 700, 720, 740 that include a voltage mode driver configured in accordance with certain aspects of this disclosure. In the first example, the I/O interface circuit 700 includes a first delay structure 702 and a voltage mode driver 704. The voltage mode driver 704 may correspond in some respects to the voltage mode driver 600 illustrated in FIG. 6. The voltage mode driver 704 is configured for single-tap equalization. However, certain concepts illustrated herein can be extended to voltage mode drivers that support multitap equalization where needed to overcome channel or interconnect losses. The voltage mode driver 704 receives a cursor signal 714 representative of signaling state of an input signal 712 (DQ) in a current UI, which may be referred to as the cursor UI or the cursor. The voltage mode driver 704 further receives a precursor signal 716 representative of signaling state of the input signal 712 in the UI that immediately precedes the current UI.

The first delay structure 702 receives the input signal 712 and generates the cursor signal 714 and the precursor signal 716. The first delay structure 702 represents an example of a power-efficient circuit for generating the cursor signal 714 and the precursor signal 716 and the first delay structure 702 may be provided using existing delay line circuits in a mixed-signal physical interface that may include circuits that may be referred to herein as MSIP circuits, components or elements. The delay line circuits may include one or more configurable delay cells (CDCs). The delay cells may be implemented using active and/or un-clocked (i.e. stateful) circuits.

In the first delay structure 702, the input signal 712 may be delayed by a programmable CDC 706 to provide the cursor signal 714 to the voltage mode driver 704. The cursor signal 714 output by the programmable CDC 706 is further delayed by a T/2 CDC 708 that adds a delay of approximately one UI to generate the precursor signal 716. Here, T/2 indicates that the delay produced by the T/2 CDC 708 corresponds to the duration of a half-cycle of the clock signal used to control double data rate transmission over the communication channel. In a double data rate interface, the UI corresponds to the duration of a half cycle of the transmitter clock signal used to control transmissions over a communication channel.

The precursor signal 716 may be used to control the first tap of the equalizing circuit. In one example, the precursor signal 716 may be provided to the gate of the deemphasis transistor 612 (see FIG. 6). In some implementations, weighting for the first tap of the equalizing circuit may be providing by controlling or configuring the resistance of the pullup resistor 614. In some implementations, weighting for the first tap of the equalizing circuit may be configured by selecting a number of driver segments to be activated in the voltage mode driver 704, including a base or default number of driver segments that receive the cursor signal 714 as an input and a number of equalizer segments that are selectively enabled by the precursor signal 716. Voltage at the I/O pad can be controlled by selecting a number of driver segments and equalizer segments that can be activated when transmitting signals over a communication channel. In some implementations, the base or minimum voltage amplitude of a transmitted signal can be configured by selecting a number of the available driver segments to be activated for nominal operation, and by selecting a subset of the selected driver segments that is disabled for deemphasis equalization. Transistors in the subset of selected driver segments are turned off for deemphasis in response to certain states of the cursor signal 714 and precursor signal 716.

In the second example, the I/O interface circuit 720 includes a second delay structure 722 and a voltage mode driver 724. The voltage mode driver 724 may correspond in some respects to the voltage mode driver 600 illustrated in FIG. 6. The voltage mode driver 724 is configured for single-tap equalization. However, certain concepts illustrated herein can be extended to voltage mode drivers that support multitap equalization where needed to overcome interconnect losses. The voltage mode driver 724 receives a cursor signal 734 representative of signaling state of an input signal 732 (DQ) in a current UI, which may be referred to as the cursor UI or the cursor. The voltage mode driver 724 further receives a precursor signal 736 representative of signaling state of the input signal 732 in the UI that immediately precedes the current UI.

In the illustrated second delay structure 722, the input signal 732 may be delayed by a first programmable CDC 726 to provide the cursor signal 734 to the voltage mode driver 724. The cursor signal 734 output by the first programmable CDC 726 is further provided to the data input of a D-flipflop 728, which is clocked by an externally generated transmit clock signal 738 used to control timing of the I/O interface circuit 720. In some implementations, the transmit clock signal 738 may be delayed using some number of buffers or inverters in order the comply with setup timing requirements defined for the D-flipflop 728. The output of the D-flipflop 728 provides the precursor signal 736.

The precursor signal 736 may be used to control the first tap of the equalizing circuit. In one example, the precursor signal 736 may be provided to the gate of a deemphasis transistor 612 (see FIG. 6). In some implementations, weighting for the first tap of the equalizing circuit may be providing by controlling or configuring the resistance of the pullup resistor 614. In some implementations, weighting for the first tap of the equalizing circuit may be configured by selecting a number of driver segments to be activated in the voltage mode driver 724, including a base or default number of driver segments that receive the cursor signal 734 as an input and a number of equalizer segments that are selectively enabled by the precursor signal 736. Voltage at the I/O pad can be controlled by selecting a number of driver segments and equalizer segments that can be activated when transmitting signals over a communication channel. In some implementations, the base or minimum voltage amplitude of a transmitted signal can be configured by selecting a number of the available driver segments to be activated for nominal operation, and by selecting a subset of the selected driver segments that is disabled for deemphasis equalization. Transistors in the subset of selected driver segments are turned off for deemphasis in response to certain states of the cursor signal 734 and precursor signal 736.

In the third example, the I/O interface circuit 730 includes a third delay structure 742 and a voltage mode driver 744. The voltage mode driver 744 may correspond in some respects to the voltage mode driver 600 illustrated in FIG. 6. The voltage mode driver 744 is configured for single-tap equalization. However, certain concepts illustrated herein can be extended to voltage mode drivers that support multitap equalization where needed to overcome interconnect losses. The voltage mode driver 744 receives a cursor signal 754 representative of signaling state of an input signal 752 (DQ) in a current UI, which may be referred to as the cursor UI or the cursor. The voltage mode driver 744 further receives a precursor signal 756 representative of signaling state of the input signal 752 in the UI that immediately precedes the current UI.

In the illustrated third delay structure 742, the input signal 752 may be delayed by a first programmable CDC 746 to provide the cursor signal 754 to the voltage mode driver 744. The input signal 752 is further provided to the data input of a D-flipflop 748, which is clocked by an externally generated transmit clock signal 758 used to control timing of the I/O interface circuit 730. The output of the D-flipflop 748 may be delayed by the second programmable CDC 750 to provide the precursor signal 756 to the voltage mode driver 744. In some implementations, the first programmable CDC 746 and the second programmable CDC 750 are configured to provide the same delay. In some implementations, the first programmable CDC 746 and the second programmable CDC 750 are independently configured and may provide different delays.

The precursor signal 756 may be used to control the first tap of the equalizing circuit. In one example, the precursor signal 756 may be provided to the gate of a deemphasis transistor 612 (see FIG. 6). In some implementations, weighting for the first tap of the equalizing circuit may be providing by controlling or configuring the resistance of the pullup resistor 614. In some implementations, weighting for the first tap of the equalizing circuit may be configured by selecting a number of driver segments to be activated in the voltage mode driver 744, including a base or default number of driver segments that receive the cursor signal 754 as an input and a number of equalizer segments that are selectively enabled by the precursor signal 756. Voltage at the I/O pad can be controlled by selecting a number of driver segments and equalizer segments that can be activated when transmitting signals over a communication channel. In some implementations, the base or minimum voltage amplitude of a transmitted signal can be configured by selecting a number of the available driver segments to be activated for nominal operation, and by selecting a subset of the selected driver segments that is disabled for deemphasis equalization. Transistors in the subset of selected driver segments are turned off for deemphasis in response to certain states of the cursor signal 754 and precursor signal 756.

Figure 8:
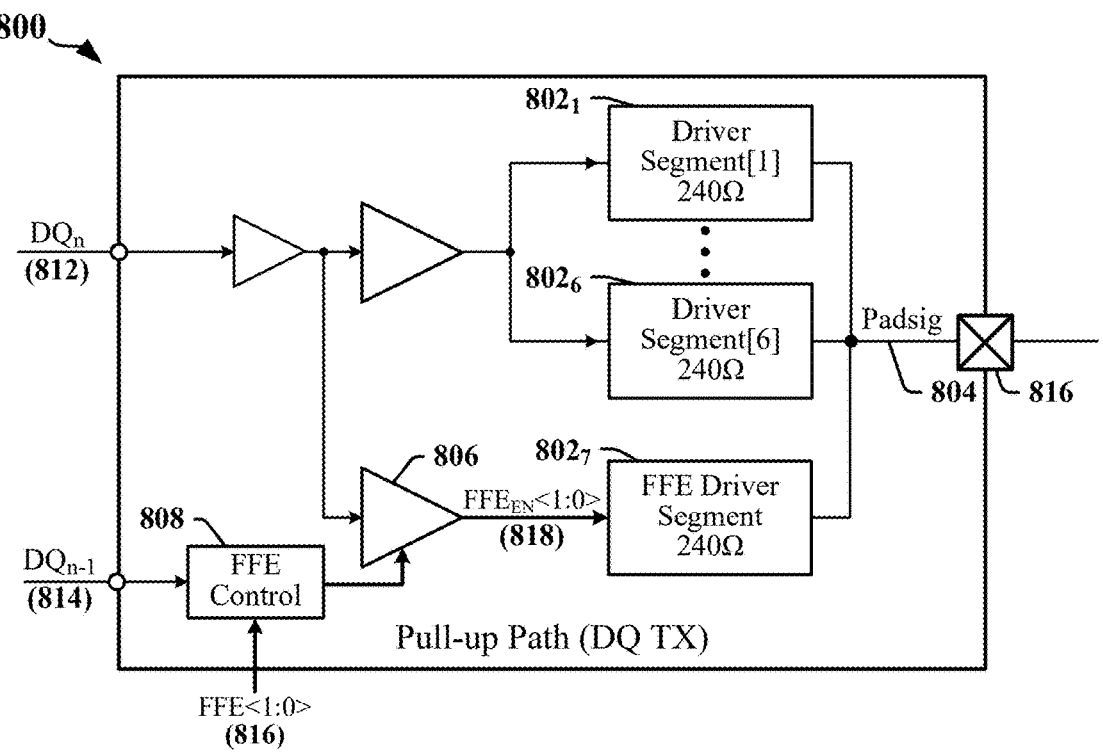
FIG. 8 illustrates an interface circuit that includes the equalizing voltage mode driver illustrated in FIG. 7.
Figure 8:
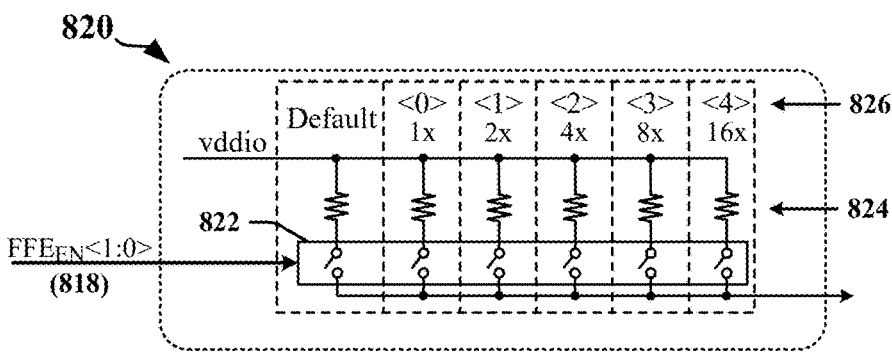
Figure 8:
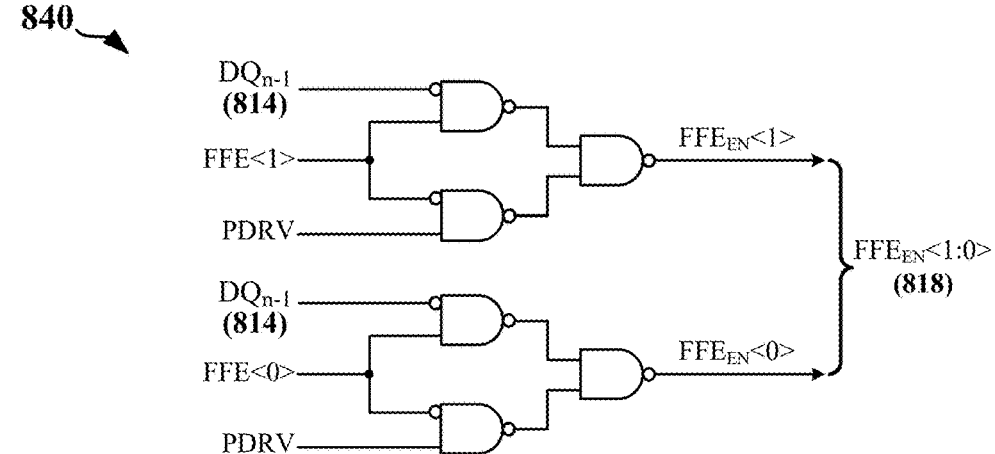

FIG. 8 illustrates an example of an interface circuit 800 that may be configured in accordance with certain aspects of this disclosure. In this example, the interface circuit 800 is configured as a pull-up path of a data transmitter (DQ TX). The interface circuit 800 may be coupled to an I/O terminal 816. In one example, the I/O terminal 816 can be coupled to a line of a high-speed parallel bus that interconnects a memory controller and one or more memory devices. For the purposes of this description, the I/O terminal 816 may correspond to a bonding pad in an IC device or SoC that facilitates bonding or contacting with a connecting wire or other interconnect.

The interface circuit 800 includes multiple driver segments $802_1$-$802_6$ and an equalizer segment $802_7$. The number of driver segments $802_1$-$802_6$ provided in the interface circuit 800 may be determined by the characteristics of the communication channel that is to be driven and the nature and value of termination at the transmitting and/or or receiving devices. Lower frequency signals may be transmitted at higher voltage levels than higher frequency signals.

The number of driver segments $802_1$-$802_6$ used to drive the communication channel may be calculated to provide a desired current or voltage level on the communication channel. The number and nature of the driver segments $802_1$-$802_6$ used to drive the communication channel may be selected to meet a specified or desired transition time of a signal to be transmitted over the communication channel through the I/O terminal 816. In one example, certain interface specifications require that interface circuits support aggressive scaling of the voltage of core power rails in order to support higher power optimization. The number and type of driver segments $802_1$-$802_6$ used to drive the communication channel may be dynamically selected based on mode of operation.

In the illustrated example, each driver segment $802_1$-$802_6$ is calibrated to provide an impedance of 240 ohms. Pull-up may be calibrated to a nominal high output voltage ($V_{OH}$) target, which may be specified with reference to the output power rail voltage (vddio). $V_{OH}$ represents the minimum required voltage swing for a defined mode of operation. In certain conventional systems, $V_{OH}$=0.5*vddio (50% of vddio) for terminated lines and $V_{OH}$=vddio for unterminated lines.

In some implementations of a memory interface, a more relaxed specification, such as a higher voltage for a memory receiver (e.g., a LPDDR receiver) is desired for higher frequency operations. For example, a higher minimum threshold voltage level (>50% of vddio) may be provided for higher frequency operations. This relaxed specification for a memory receiver can result in additional complexity in a conventional transmitter (e.g., an SoC) with increased power dissipation, terminal capacitance and leakage. An interface circuit located in the transmitter and configured in accordance with certain aspects of this disclosure can accommodate the higher vddio threshold while reducing power consumption for transmissions of strings of bits with unchanging bit values.

In certain implementations, the structure and configuration of the equalizer segment $802_7$ may correspond closely to the structure and configuration of the driver segments $802_1$-$802_6$, with the configuration of input signals determining the respective functions of the segments $802_1$-$802_7$. In the interface circuit 800, for example, seven segments $802_1$-$802_7$ are used to drive an output signal 804 through the I/O terminal 816 to meet the higher vddio target. The interface circuit 800 may be trained with all seven segments $802_1$-$802_7$ actively driving the output signal 804. The equalizer segment $802_7$ may be disabled to provide de-emphasis when equalization is required.

According to certain aspects of this disclosure, the interface circuit 800 drives the output signal 804 using seven segments $802_1$-$802_7$ when a binary 1 bit is to be transmitted after a binary 0 bit, and drives the output signal 804 using six segments $802_1$-$802_6$ when a binary 1 bit is to be transmitted after a preceding binary 1 bit.

In some implementations, the six segments $802_1$-$802_6$ may be configured to drive to the output signal 804 to 50% of vddio and the equalizer segment $802_7$ may be configured to ensure that the output signal 804 can reach a higher vddio target (e.g., >50% vddio) by controlling the impedance of the "5%" equalizer segment $802_7$. In one example, an impedance control circuit 820 may be used to configure the impedance of the equalizer segment $802_7$ using a 2-bit FFE selection signal 818 (FFE$_{EN}$).

In certain implementations, de-emphasis of the signals at the circuit ground voltage level (i.e., binary 0 bits) is not performed and the pulldown path for the output signal 804 is unaffected by equalization. In one example, the pull-down path includes the pulldown driver transistor 606 and the pulldown resistor 608, which may be replicated in each of six segments $802_1$-$802_6$. The limitation of pre-emphasis to the pullup path can reduce pre-driver complexity in an equalizing interface circuit such as the illustrated interface circuit 800.

Power savings at the output of the interface circuit 800 may be estimated or calculated based on current flow through the I/O terminal 816. For an output impedance of 400, a reduction in current of 625 μA may be observed when the equalizer segment $802_7$ using is disabled.

Operation of the interface circuit 800 may be appreciated through continued reference to the examples illustrated in FIGS. 6-8. The cursor signal 754 (see FIG. 7) may be provided to six driver segments $802_1$-$802_6$ provided in the interface circuit 800 while a control signal (the FFE selection signal 818) is derived using the precursor signal 756, and provided to the equalizer segment $802_7$. The equalizer segment $802_7$ is enabled for UIs that commence with positive transitions (e.g., transitions 632, 636 in FIG. 6) and disabled for UIs that do not include a positive transition. In this example, the six driver segments $802_1$-$802_6$ are coupled in parallel and respond to the cursor input 812 to drive the I/O terminal 816. The driver segments $802_1$-$802_6$ may be configured to enable the interface circuit 800 to meet a minimum transmission voltage level (50% of vddio). The equalizer segment $802_7$ is configured to drive the I/O terminal 816 based on signaling states of the cursor input 812 and the precursor input 814 state. The equalizer segment $802_7$, when enabled may be configured to cause the interface circuit 800 drive the I/O terminal 816 to a transmission voltage level that is higher than 50% of vddio. The interface circuit 800 transmits at 50% of vddio for unchanging consecutive high states (i.e. the output remains at the '1' logic state).

In accordance with certain aspects of this disclosure, the impedance of the equalizer segment $802_7$ in the illustrated interface circuit 800 may be scaled. The illustrated interface circuit 800 includes an FFE controller 808 and a tri-state buffer 806 that are configured to provide an FFE selection signal 818 (FFE$_{EN}$) that controls the output impedance of the equalizer segment $802_7$. In some implementations, the FFE controller 808 selects a number of equalizer segments to be active during positive transitions. In some implementations, the FFE controller 808 can be used to configure the impedance presented at the output of a single equalizer segment.

In the impedance control circuit 820, a set of switches 822 is controlled by the FFE selection signal 818. The set of switches 822 can enable various combinations of resistors 824 to be coupled to the vddio rail during any desired UI. In one example, the FFE selection signal 818 encodes a multibit binary value in which each bit 826 is configured to cause a set of parallel connected resistances to be coupled to the vddio rail. In one example, each bit of the FFE selection signal 818 carries a weight (n) that causes $2^n$ parallel connected resistances to be coupled to the vddio rail.

In some implementations, the FFE selection signal 818 encodes a unary encoded value. Unary encoding, which may be referred to as thermometer encoding, represents data in the quantity of bits set to '1' that precede a terminating '0', or in the quantity of bits set to '0' that precede a terminating '1'. The use of thermometer encoding and other such encoding to accelerate selection of driver circuit impedance can impose a relatively high penalty in the physical area on a semiconductor die needed to implement the driver circuit.

An example of logic circuit 840 associated with FFE control is provided in FIG. 8. The logic circuit 840 is configured to generate enable signals that can be used to turn on a combination of the set of switches 822 based on signaling state of the precursor input 814.

In accordance with certain aspects of this disclosure, the interface circuit 800 may include an equalizing transmitter that is or can be coupled to a communication channel. In one example, the communication channel may be configured as a serial communication channel. The equalizing transmitter may include a plurality of driver segments, at least one equalizer segment, a delay element and a logic circuit. Each driver segment in the plurality of driver segments includes a pullup transistor that is configured to couple the communication channel to a first voltage rail when an input signal is in a first signaling state. The at least one equalizer segment includes a pullup transistor configured to couple the communication channel to the first voltage rail when turned on. The delay element is configured to provide a precursor signal that is a delayed version of the input signal. The logic circuit is responsive to the precursor signal and provides an enabling signal that enables the at least one equalizer segment to be turned on when the precursor signal is in a second signaling state.

In certain implementations, each of the plurality of driver segments includes a pulldown transistor that is configured to couple the communication channel to a second voltage rail when the input signal is in a second signaling state.

In certain implementations, the precursor signal is delayed by at least one UI in which a data bit is transmitted over the communication channel. The delay element may include a configurable delay cell that is configured to delay the input signal by the at least one UI with respect to an edge in a clock signal used to define the UI.

In certain implementations, the delay element includes a flipflop that is configured to add a delay to the precursor signal corresponding to duration of a UI in which a data bit is received in the input signal.

In certain implementations, the enabling signal is a multibit signal that configures the value of a pullup resistance used to couple the communication channel to the first voltage rail when the at least one equalizer segment turned on. The logic circuit may be configured to refrain from providing the enabling signal when the precursor signal is in the first signaling state.

Figure 9:
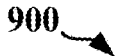
FIG. 9 is a flow diagram illustrating an example of a method for equalizing a data signal transmitted over a communication channel in accordance with certain aspects disclosed herein.
Figure 9:
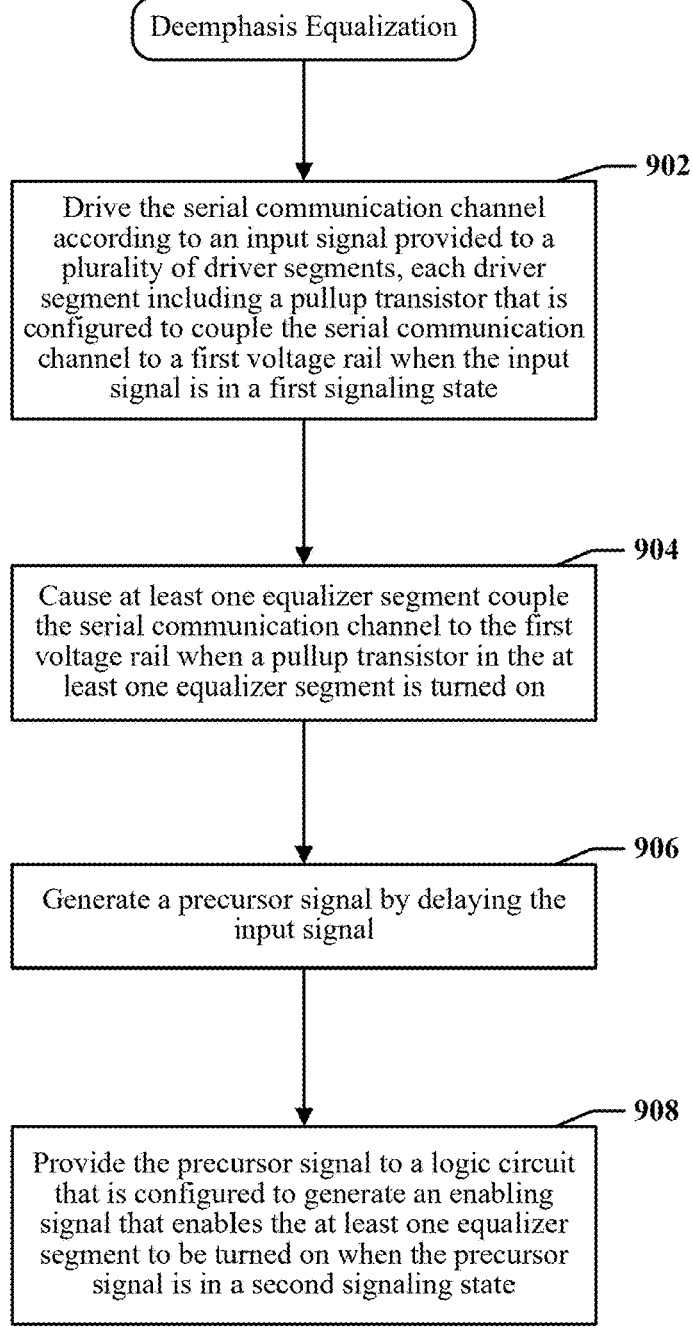

FIG. 9 is a flow diagram illustrating an example of a method 900 for equalizing a data signal transmitted over a communication channel in accordance with certain aspects disclosed herein. The method 900 may be implemented in a transmitter coupled to the serial transmission line. At block 902, the transmitter may drive the communication channel according to an input signal provided to a plurality of driver segments. Each driver segment may include a pullup transistor that is configured to couple the communication channel to a first voltage rail when the input signal is in a first signaling state. At block 904, the transmitter may cause at least one equalizer segment couple the communication channel to the first voltage rail when a pullup transistor in the at least one equalizer segment is turned on. At block 906, the transmitter may generate a precursor signal by delaying the input signal. At block 908, the transmitter may provide the precursor signal to a logic circuit that is configured to generate an enabling signal that enables the at least one equalizer segment to be turned on when the precursor signal is in a second signaling state.

In certain examples, the transmitter may cause the plurality of driver segments to couple the communication channel to a second voltage rail when the input signal is in a second signaling state.

In some implementations, the precursor signal is delayed by at least one UI in which a data bit is transmitted over the communication channel. The input signal may be delayed using a configurable delay cell to delay the input signal by the at least one UI with respect to an edge in a clock signal used to define the UI.

In certain examples, delaying the input signal includes using a flipflop to add a delay to the precursor signal corresponding to duration of a UI in which a data bit is received in the input signal.

In certain examples, the enabling signal is a multibit signal that configures the value of a pullup resistance used to couple the communication channel to the first voltage rail when the at least one equalizer segment turned on.

The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus includes means for driving a communication channel according to an input signal received at the apparatus, including a pullup transistor in each of a plurality of driver segments that is configured to couple the communication channel to a first voltage rail when the input signal is in a first signaling state; means for equalizing signals transmitted over the communication channel, including at least one equalizer segment configured to provide deemphasis when the input signal transitions to the first signaling state; means for generating a precursor signal by delaying the input signal; and means for enabling the at least one equalizer segment when the precursor signal is in a second signaling state.

In some implementations, each of the plurality of driver segments includes a pulldown transistor that is configured to couple the communication channel to a second voltage rail when the input signal is in a second signaling state.

In certain implementations, the precursor signal is delayed by at least one UI in which a data bit is transmitted over the communication channel. The means for generating the precursor signal may include a configurable delay cell configured to delay the input signal by the at least one UI with respect to an edge in a clock signal used to define the UI.

In some examples, the means for generating the precursor signal includes a flipflop clocked by a clock signal used to control transmission over the communication channel. The flipflop may be configured to add a delay to the precursor signal corresponding to duration of the UI.

In some examples, the means for enabling the at least one equalizer segment is configured to generate a multibit signal that configures the value of a pullup resistance used to couple the communication channel to the first voltage rail when the at least one equalizer segment turned on.

In certain implementations, the means for enabling the at least one equalizer segment is configured to disable the at least one equalizer segment when the precursor signal is in the first signaling state.

Some implementation examples are described in the following numbered clauses:

1. An equalizing transmitter coupled to a communication channel, comprising: a plurality of driver segments, each driver segment including a pullup transistor that is configured to couple the communication channel to a first voltage rail when an input signal is in a first signaling state; at least one equalizer segment that includes a pullup transistor configured to couple the communication channel to the first voltage rail when turned on; a delay element configured to provide a precursor signal that is a delayed version of the input signal; and a logic circuit responsive to the precursor signal and that provides an enabling signal that enables the at least one equalizer segment to be turned on when the precursor signal is in a second signaling state.

2. The equalizing transmitter as described in clause 1, wherein each of the plurality of driver segments comprises: a pulldown transistor that is configured to couple the communication channel to a second voltage rail when the input signal is in a second signaling state.

3. The equalizing transmitter as described in clause 1 or clause 2, wherein the precursor signal is delayed by at least one unit interval (UI) in which a data bit is transmitted over the communication channel.

4. The equalizing transmitter as described in clause 3, wherein delay element comprises: a configurable delay cell that is configured to delay the input signal by the at least one UI with respect to an edge in a clock signal used to define the UI.

5. The equalizing transmitter as described in any of clauses 1-4, wherein delay element comprises: a flipflop that is configured to add a delay to the precursor signal corresponding to duration of a UI in which a data bit is received in the input signal.

6. The equalizing transmitter as described in any of clauses 1-5, wherein the enabling signal comprises a multibit signal that configures the value of a pullup resistance used to couple the communication channel to the first voltage rail when the at least one equalizer segment turned on.

7. The equalizing transmitter as described in any of clauses 1-6, wherein the logic circuit is configured to refrain from providing the enabling signal when the precursor signal is in the first signaling state.

8. An apparatus comprising: means for driving a communication channel according to an input signal received at the apparatus, including a pullup transistor in each of a plurality of driver segments that is configured to couple the communication channel to a first voltage rail when the input signal is in a first signaling state; means for equalizing signals transmitted over the communication channel, including at least one equalizer segment configured to provide deemphasis when the input signal transitions to the first signaling state; means for generating a precursor signal by delaying the input signal; and means for enabling the at least one equalizer segment when the precursor signal is in a second signaling state.

9. The apparatus as described in clause 8, wherein each of the plurality of driver segments comprises: a pulldown transistor that is configured to couple the communication channel to a second voltage rail when the input signal is in a second signaling state.

10. The apparatus as described in clause 8 or clause 9, wherein the precursor signal is delayed by at least one unit interval (UI) in which a data bit is transmitted over the communication channel.

11. The apparatus as described in clause 10, wherein the means for generating a precursor signal comprises: a configurable delay cell configured to delay the input signal by the at least one UI with respect to an edge in a clock signal used to define the UI.

12. The apparatus as described in any of clauses 8-11, wherein the means for generating a precursor signal comprises: a flipflop clocked by a clock signal used to control transmission over the communication channel, wherein the flipflop is configured to add a delay to the precursor signal corresponding to duration of the UI.

13. The apparatus as described in any of clauses 8-12, wherein the means for enabling the at least one equalizer segment is configured to generate a multibit signal that configures the value of a pullup resistance used to couple the communication channel to the first voltage rail when the at least one equalizer segment turned on.

14. The apparatus as described in any of clauses 8-13, wherein the means for enabling the at least one equalizer segment is configured to disable the at least one equalizer segment when the precursor signal is in the first signaling state.

15. A method for equalizing a data signal transmitted over a communication channel. comprising: driving the communication channel according to an input signal provided to a plurality of driver segments, each driver segment including a pullup transistor that is configured to couple the communication channel to a first voltage rail when the input signal is in a first signaling state; causing at least one equalizer segment couple the communication channel to the first voltage rail when a pullup transistor in the at least one equalizer segment is turned on; providing a precursor signal by delaying the input signal; and providing the precursor signal to a logic circuit that is configured to generate an enabling signal that enables the at least one equalizer segment to be turned on when the precursor signal is in a second signaling state.

16. The method as described in clause 15, further comprising: causing the plurality of driver segments to couple the communication channel to a second voltage rail when the input signal is in a second signaling state.

17. The method as described in clause 15 or clause 16, wherein the precursor signal is delayed by at least one unit interval (UI) in which a data bit is transmitted over the communication channel.

18. The method as described in clause 17, wherein delaying the input signal comprises: using a configurable delay cell to delay the input signal by the at least one UI with respect to an edge in a clock signal used to define the UI.

19. The method as described in any of clauses 15-18, wherein delaying the input signal comprises: clocking using a flipflop to add a delay to the precursor signal corresponding to duration of a UI in which a data bit is received in the input signal.

20. The method as described in any of clauses 15-19, wherein the enabling signal comprises a multibit signal that configures the value of a pullup resistance used to couple the communication channel to the first voltage rail when the at least one equalizer segment turned on.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An equalizing transmitter coupled to a communication channel, comprising:
   a plurality of driver segments, each driver segment including a pullup transistor that is configured to couple the communication channel to a first voltage rail when an input signal is in a first signaling state;
   at least one equalizer segment that includes a pullup transistor configured to couple the communication channel to the first voltage rail when turned on;
   a delay element configured to provide a precursor signal that is a delayed version of the input signal; and
   a logic circuit responsive to the precursor signal and that provides an enabling signal that enables the at least one equalizer segment to be turned on when the precursor signal is in a second signaling state.

2. The equalizing transmitter of claim 1, wherein each of the plurality of driver segments comprises:
   a pulldown transistor that is configured to couple the communication channel to a second voltage rail when the input signal is in a second signaling state.

3. The equalizing transmitter of claim 1, wherein the precursor signal is delayed by at least one unit interval (UI) in which a data bit is transmitted over the communication channel.

4. The equalizing transmitter of claim 3, wherein delay element comprises:

a configurable delay cell that is configured to delay the input signal by the at least one UI with respect to an edge in a clock signal used to define the UI.

5. The equalizing transmitter of claim 1, wherein delay element comprises:

a flipflop that is configured to add a delay to the precursor signal corresponding to duration of a UI in which a data bit is received in the input signal.

6. The equalizing transmitter of claim 1, wherein the enabling signal comprises a multibit signal that configures a resistance value for a pullup resistance used to couple the communication channel to the first voltage rail when the at least one equalizer segment turned on.

7. The equalizing transmitter of claim 1, wherein the logic circuit is configured to refrain from providing the enabling signal when the precursor signal is in the first signaling state.

8. An apparatus comprising:

means for driving a communication channel according to an input signal received at the apparatus, including a pullup transistor in each of a plurality of driver segments that is configured to couple the communication channel to a first voltage rail when the input signal is in a first signaling state;

means for equalizing signals transmitted over the communication channel, including at least one equalizer segment configured to provide deemphasis when the input signal transitions to the first signaling state;

means for generating a precursor signal by delaying the input signal; and means for enabling the at least one equalizer segment when the precursor signal is in a second signaling state.

9. The apparatus of claim 8, wherein each of the plurality of driver segments comprises:

a pulldown transistor that is configured to couple the communication channel to a second voltage rail when the input signal is in a second signaling state.

10. The apparatus of claim 8, wherein the precursor signal is delayed by at least one unit interval (UI) in which a data bit is transmitted over the communication channel.

11. The apparatus of claim 10, wherein the means for generating a precursor signal comprises:

a configurable delay cell configured to delay the input signal by the at least one UI with respect to an edge in a clock signal used to define the UI.

12. The apparatus of claim 8, wherein the means for generating a precursor signal comprises:

a flipflop clocked by a clock signal used to control transmission over the communication channel, wherein the flipflop is configured to add a delay to the precursor signal corresponding to duration of a UI in which a data bit is transmitted over the communication channel.

13. The apparatus of claim 8, wherein the means for enabling the at least one equalizer segment is configured to generate a multibit signal that configures a resistance value for a pullup resistance used to couple the communication channel to the first voltage rail when the at least one equalizer segment turned on.

14. The apparatus of claim 8, wherein the means for enabling the at least one equalizer segment is configured to disable the at least one equalizer segment when the precursor signal is in the first signaling state.

15. A method for equalizing a data signal transmitted over a communication channel, comprising:

driving the communication channel according to an input signal provided to a plurality of driver segments, each driver segment including a pullup transistor that is configured to couple the communication channel to a first voltage rail when the input signal is in a first signaling state;

causing at least one equalizer segment couple the communication channel to the first voltage rail when a pullup transistor in the at least one equalizer segment is turned on;

generating a precursor signal by delaying the input signal; and providing the precursor signal to a logic circuit that is configured to generate an enabling signal that enables the at least one equalizer segment to be turned on when the precursor signal is in a second signaling state.

16. The method of claim 15, further comprising:

causing the plurality of driver segments to couple the communication channel to a second voltage rail when the input signal is in a second signaling state.

17. The method of claim 15, wherein the precursor signal is delayed by at least one unit interval (UI) in which a data bit is transmitted over the communication channel.

18. The method of claim 17, wherein delaying the input signal comprises:

using a configurable delay cell to delay the input signal by the at least one UI with respect to an edge in a clock signal used to define a UI in which a data bit is transmitted over the communication channel.

19. The method of claim 15, wherein delaying the input signal comprises:

using a flipflop to add a delay to the precursor signal corresponding to duration of a UI in which a data bit is received in the input signal.

20. The method of claim 15, wherein the enabling signal comprises a multibit signal that configures a resistance value for a pullup resistance used to couple the communication channel to the first voltage rail when the at least one equalizer segment turned on.

* * * * *